United States Patent

[11] 3,615,471

[72] Inventors Jean Paul Lenoble
Paris;
Bertrand Jacques Albert, Blanc Mesne;
Francois G. Bochard, Fontannebleau;
Jacques A. Coquard, Paris; Roger A.
Norture, Boissy Saint Leger, all of France

[21] Appl No. 751,908
[22] Filed Aug. 12, 1968
[45] Patented Oct. 26, 1971
[73] Assignee International Business Machines Corporation
Armonk, N.Y.
[32] Priority Aug. 16, 1967
[33] France
[31] 8645AM

[54] METHOD FOR MAKING OPTICAL MASKS
10 Claims, 4 Drawing Figs.

[52] U.S. Cl. .......... 96/38.3, 96/36.2, 96/38.4, 117/212
[51] Int. Cl. .......... G03c 5/00, G03c 11/00
[50] Field of Search .......... 96/36.2, 38.3, 38.4, 48 PD; 117/212; 204/15

[56] References Cited

UNITED STATES PATENTS

| | | | |
|---|---|---|---|
| 3,006,819 | 10/1961 | Wilson et al. .......... | 204/15 |
| 3,080,232 | 3/1963 | Gilbody et al. .......... | 96/36.2 |
| 3,390,988 | 7/1968 | Dippel et al. .......... | 96/48 PD |
| 3,424,581 | 1/1969 | Nawn .......... | 96/38.4 |
| 3,492,206 | 1/1970 | Honjo .......... | 204/15 |

*Primary Examiner*—David Klein
*Attorneys*—Hanifin and Jancin and Julius B. Kraft ABSTRACT: A method of producing optical masks by coating one surface of a transparent plate with a photoresist layer containing, as an additive, a catalyst for subsequent electroless deposition. The photoresist layer is exposed to a light pattern which activates the conventional sensitizer contained in the photoresist layer to harden the photoresist in the exposed areas. The photoresist is then treated with a developer which removes the unexposed, unhardened areas, leaving a pattern corresponding to the light pattern of photoresist containing a catalyst for electroless deposition. The substrate is then treated with a conventional electroless deposition bath which selectively deposits the metal in the areas coated with the photoresist pattern.

INVENTORS
JEAN P. LENOBLE
BERTRAND J. ALBERT
FRANÇOIS G. BOCHARD
JACQUES A. COQUARD
ROGER A. NORTURE

BY J. B. Kraft
ATTORNEY

METHOD FOR MAKING OPTICAL MASKS

BACKGROUND OF THE INVENTION

1. Field of the Invention

This invention relates to a photographic process for making masks, particularly masks which are to be used in the exposure of photosensitive polymeric coatings or photoresists in the fabrication of microelectronic semiconductor devices such as integrated circuits or individual components, e.g., transistors. The semiconductor device art has been continuously miniaturizing its components and circuits in order to achieve low cost, durable units capable of performing electronic functions at very high speeds. These elements are fabricated in large numbers simultaneously. Between 100 and 500 integrated circuit units can be fabricated simultaneously on a silicon wafer which is about 1 inch in diameter and less than 1/100th of an inch thick. In these simultaneous fabrication approaches, it is necessary to perform various fabrication processes such as impurity diffusion, epitaxial growth and metallization in minute selected areas over the entire wafer without affecting the remaining area on the wafer. In order to define the minute areas at which a particular fabrication step is to be performed, photosensitive polymeric coatings or photoresists are coated over the wafer and exposed to ultraviolet light through a contact optical mask to produce an exposure pattern, after which the minute areas which are to be processed in the given fabrication step are uncovered by removing photoresist and etching, and the remaining areas are left covered by the photoresist. At least one individual optical mask is required for each step in semiconductor fabrication.

2. Description of the Prior Art

In the production of such optical masks, the primary problems encountered by the prior art have been the maintenance of high resolution and edge definition in masks having high density or covering power. The masks must have resolutions sufficient to handle patterns of one micron lines separated by one micron. The conventional photographic emulsion layers have been found to be deficient in the provision of the combination of high resolution and high density required in such optical masks. Conventional masks made of a developed photographic emulsion plate lack resolution and edge definition. For example, in order to obtain an image of acceptable high resolution, a gelatin layer in the order of 6 micron thickness has to be used.

Such a prior art structure is shown in FIG. 1A. Emulsion 11 is carried on transparent plate 10. The developed metallic image, after exposure to light pattern 12, is shown at 13. The overlap 14 between the pattern of a pair of 1 micron lines 15 is sufficient to cause pure image resolution. Another prior art approach utilizes a thin, evaporated layer of metal on a glass substrate which is subsequently selectively etched to leave metal in the mask pattern. In etching the metal layer, a photoresist pattern must be used to prevent the removal of metal from the opaque areas. In order that the underlying metal be adequately protected against the etchant, the photoresist pattern must have a minimum thickness of 0.5 micron. Utilizing a photoresist pattern of such thickness, as shown in FIG. 1B in which photoresist pattern 16 is positioned on metal layer 17, edge definition problems tend to occur when dealing with lines in the order of 1 micron. The structure in FIG. 1B shows a section wherein the etching between a pair of metal lines has not been sufficient to remove all of the metal necessary to avoid contact between the lines.

The problems of the prior art may be conveniently summarized as primarily resulting from the relatively thick layer or composite of layers which must be exposed to the light pattern in the process for mask formation.

SUMMARY OF THE INVENTION

Accordingly, it is an object of this invention to provide a mask fabrication process in which it is not necessary to expose relatively thick layers or composites to light patterns during mask fabrication.

It is a further object of this invention to provide a method for producing optical masks having both high resolution and high density.

The present invention accomplishes these objects by a process in which the layer which is to provide the opacity is not present in the mask during the step of exposure to the light image. Rather, it is selectively applied in the desired pattern after the exposure step. This is accomplished by including in a photoresist layer coated on the transparent substrate a catalyst for subsequent electroless deposition. Then, the layer is exposed to a light pattern and developed in the conventional manner to leave a photoresist pattern corresponding to the light pattern. At this point, the opaque pattern is formed by treating the substrate with a standard electroless deposition bath from which metal is deposited on the photoresist layer because of the electroless catalyst present within the limits of this layer.

The photoresist layer containing the catalyst may be relatively very thin, e.g., in order of 200 Sufficient catalyst may be contained in such a thin layer to provide the nucleation sites for the subsequent deposition of a high opacity, high resolution masking of metal by electroless deposition.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figures 1A, 1B, 1C:
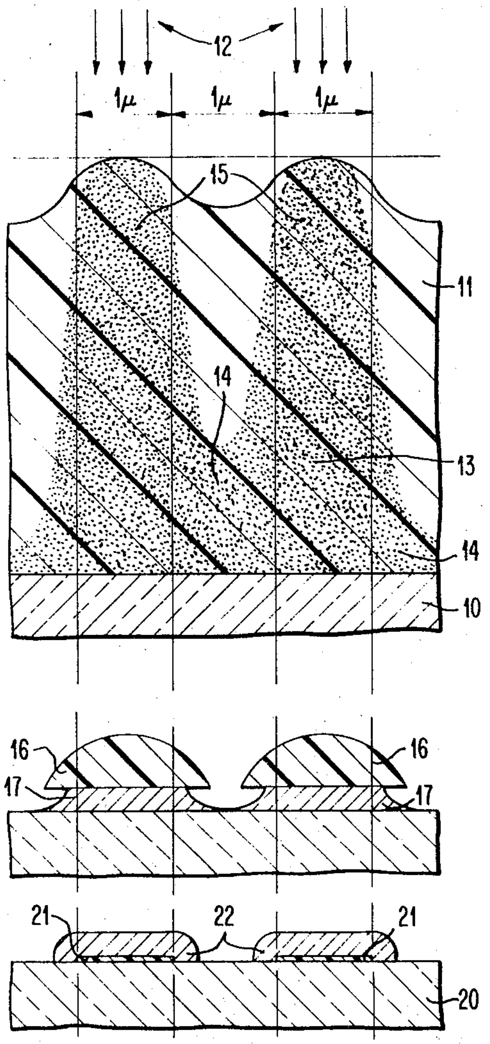
FIG. 1A is a diagrammatic representation of a partial cross section of a mask formed from photographic emulsion in accordance with the prior art.
FIG. 1B is a diagrammatic representation of a partial cross section of a mask formed by selective etching a metal layer in accordance with the prior art.
FIG. 1C is a diagrammatic representation of a partial cross section of a mask formed in accordance with the process of the present invention.

The following are illustrative examples of preferred embodiments of the present invention:

EXAMPLE I

The following photoresist compositions are thoroughly mixed and applied to an optical glass plate:

| | |
|---|---|
| polyvinyl alcohol | 15 g. |
| potassium bichromate | 4 g. |
| palladium chloride | 17 cc of a solution including **10** 10g/1 of metal palladium |
| water for obtaining 1,000 cc. | (pH6, viscosity 3.8 cps at 20°C.) |

The plate is exposed through a light pattern to a 200 watt mercury arc lamp for about one minute. The plate is then developed utilizing a deionized, agitated water bath for about 5 minutes. This removes the photoresist composition from the areas which are to be transparent. The developed plate is cured at 190° for 15 minutes.

Nickel metal is then selectively applied in the areas corresponding to the photoresist pattern by immersing the plate into an electroless plating bath of the following composition for about 3 minutes:

| | |
|---|---|
| nickel sulfate ($NiSO_4.7H_2O$) | 30 g./1 |
| sodium hypophosphite ($NaH_2PO_3.H_2O$) | 25 g./1 |
| sodium citrate ($C_6H_5O_7Na_3.H_2O$) | 10 g./1 |
| sodium acetate ($NaC_2H_3O_2.3H_2O$) | 10 g./1 |
| boric acid ($H_3BO_3$) | 3 g./1 |
| wetting agent | 0.25 cc./1 |
| Brightener | 5 cc./1 |

If copper is to be plated instead of nickel, the following electroless bath may be used:

COPPER BATH

This bath consists of two parts which are mixed when said bath is used and is composed of from 4 to 6 parts of B for 100 parts of A.

PART A 30 to 40 g/l of Rochelle's salt (potassium and sodium bitartrate)
10 to 15 g/l of sodium hydroxide
6 to 7 g/l of copper sulphate
5 to 6 g/l of sodium carbonate

| | | |
|---|---|---|
| Part A. | 30 to 40 g/l | of Rochelle's salt (potassium and sodium bitartrate) |
| | 10 to 15 g/l | of sodium hydroxide |
| | 6 to 7 g/l | of copper sulphate |
| | 5 to 6 g/l | of sodium carbonate |
| | deionized water in order to obtain one liter | |
| Part B. | formaldehyde at 30% | |
| | (PH = 11 to 12.5) | |

This bath operates at room temperature.

If cobalt is to be used in place of nickel, the following electroless bath may beused:

Cobalt bath

| | |
|---|---|
| 25 to 30 g/l | of cobalt chloride |
| 20 to 25 g/l | of sodium hypophosphite |
| 25 to 35 g/l | of sodium citrate |
| 45 to 55 g/l | of ammonium chloride |
| deionized water in order to obtain one liter | |
| (PH = 9 to 10) | |

This bath operates at 75°C.

Each of the masks produced utilizing said baths is a high resolution, high opacity mask.

EXAMPLE II

In place of the photoresist composition of example I, the following composition is used:

| | |
|---|---|
| Solution of 25 g. polyvinyl alcohol in 1,000 cc deionized water | 1,000 cc. |
| Solution of 5 g. of potassium bichromate in 100 cc deionized water | 80 cc. |
| 2.5 g. of palladium chloride, 4.5 g. disodium fluorescin in 100 cc of deionized water | 40 cc. |

Then, following the procedure of example I and utilizing any of the four electroless plating baths described in example I, high resolution, high opacity optical masks are produced.

Figure 2:
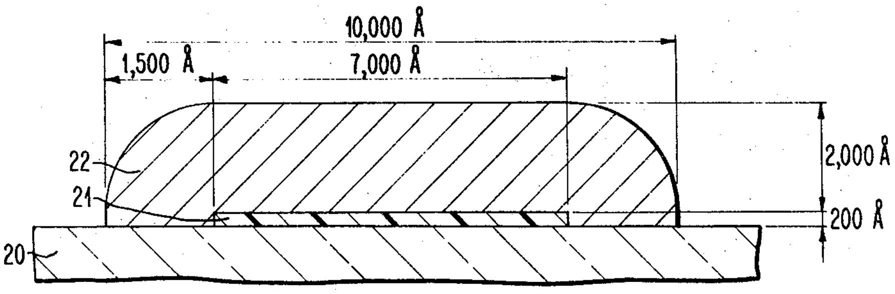
FIG. 2 is an enlarged view of a portion of FIG. 1C which more clearly illustrates the elements of the mask of the present invention.

Diagrammatic cross sections of masks produced in accordance with the present invention are illustrated in FIGS. 1C and 2. A transparent glass support 20 carries a photoresist pattern 21 containing the catalyst for the subsequently deposited opacifying metal 22. FIG. 2 is an enlarged view of the embodiment showing the dimensions in A. of a typical mask line which may be formed accordance with the present invention.

While the above illustrative examples describe a process wherein the catalyst is incorporated into a polyvinyl alcohol/potassium bichromate photoresist layer, the process of the present invention may be practiced by incorporating the catalyst for subsequent electroless deposition into any conventional photoresist material. An overall survey of photoresist coatings which may be utilized is found in the article—"The Photoresist Story—From Niepce to the Modern Polymer Chemist," by M. Hepher, appearing at pages 181–190, Journal of Photographic Science, volume 12, 1964. Photoresists include natural colloids such as albumen, gelatin, fish glue—which are generally sensitized by chromate salts such as potassium bichromate, as well as synthetic resins such as polyvinyl cinnamate, polymethyl methacrylate. A description of such synthetic resins and the light sensitizers conventionally used in combination with them may also be found in the text—"Light Sensitive Systems," by Jaromir Kosar, particularly at Chapter 4. Some photoresist compositions of this type are described in U.S. Pat. Nos. 2,610,120; 3,143,423; and 3,169,868.

In addition to (negative) photoresist in which the areas exposed to light are rendered insoluble in the developer, there may also be used (positive) photoresist in which a coating normally insoluble in the developer is rendered soluble in the areas exposed to light. Such photoresists, such as those described in U.S. Pat. Nos. 3,046,120 and 3,201,239, include the diazo type photoresists which change to azo compounds in the areas exposed to light, which are thereby rendered soluble in the developer solution.

The catalyst incorporated into photoresist material may be any conventional catalyst for electroless deposition. Among these catalysts are the noble metals such as palladium, gold or silver in the form of salts, particularly chlorides.

Metal deposited from the electroless solution onto the photoresist pattern are preferably of lower electrochemical potential than catalyst metal. Metals which can be so plated include, in addition to the noble metals themselves, copper, tin, nickel, cobalt and rhodium.

While the transparent substrate is preferably glass, it should be noted that substrates of other transparent materials which are unaffected by the chemical processing involved may also be used.

FIG. 2, showing the dimensions of a typical line structure which may be formed by the procedure set forth in the examples, indicates the relatively small thickness of the layers in the structure exposed to the light pattern. Since the edge definition problems of the prior art appear to be related to the thickness of the layers in the structure exposed to the light pattern, it may be seen how the structure of the present invention avoids this problem. For example, as shown in FIG. 2, when forming a line on the mask which is 1 micron or 10,000 A. wide, an initial deposition of photoresist 21, 7,000 A. wide and 200 A. thick, is deposited. A nickel deposit 22, 2,000 A. in thickness, will give the preferable opacity. such a deposit will entail side deposits of approximately 1,500 A. in width, thereby providing a line in the order of 10,000 A. or 1 micron.

It has been found that the process of the present invention is even further enhanced by the inclusion in the photoresist composition of a stabilizer for the catalyst. Disodium fluorescin provides an excellent stabilizer for the catalyst, particularly palladium chloride catalyst. The inclusion of such a stabilizer enhances the uniformity and controllability of the deposition.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming a metallic pattern on a substrate comprising:
   - forming on one surface of said substrate a photoresist layer comprising a photoresist material which on exposure to light, undergoes a change in solubility, a catalyst for electroless deposition and a stabilizer for the catalyst;
   - exposing the photoresist layer to light pattern;
   - developing the exposed layer to leave a photoresist pattern corresponding to the light pattern on said surface; and
   - treating the substrate with an electroless deposition solution to selectively deposit metal in the areas coated with photoresist.
2. The method of claim 1 wherein said substrate is transparent and an optical mask is formed.
3. The method of claim 1 wherein said stabilizer is disodium fluorescin.
4. The method of claim 1 wherein said photoresist material comprises a polymeric material and a sensitizer which on exposure to light, changes the solubility of the polymeric material.
5. The method of claim 4 wherein said polymeric material is a synthetic resin.
6. The method of claim 5 wherein said polymeric material is polyvinyl alcohol.
7. The method of claim 5 wherein said sensitizer potassium bichromate.
8. The method of claim 1 wherein said catalyst is a salt of a noble metal having a higher electrochemical potential than the metal to be deposited.
9. The method of claim 8 wherein said catalyst is palladium chloride.
10. The method of claim 9 wherein the deposited metal is nickel.